United States Patent
Jang (10) Patent No.: US 10,255,851 B2
(45) Date of Patent: Apr. 9, 2019

(54) EMISSION DRIVER AND DISPLAY DEVICE INCLUDING THE SAME

(71) Applicant: SAMSUNG DISPLAY CO., LTD., Yongin-si, Gyeonggi-do (KR)

(72) Inventor: Hwan-Soo Jang, Asan-si (KR)

(73) Assignee: SAMSUNG DISPLAY CO., LTD., Yongin-si,Gyeonggi-do (KR)

(*) Notice: Subject to any disclaimer, the term of this patent is extended or adjusted under 35 U.S.C. 154(b) by 21 days.

(21) Appl. No.: 15/468,629

(22) Filed: Mar. 24, 2017

(65) Prior Publication Data

US 2017/0287395 A1    Oct. 5, 2017

(30) Foreign Application Priority Data

Apr. 5, 2016 (KR) .................. 10-2016-0041595

(51) Int. Cl.
 *G09G 3/32* (2016.01)
 *G09G 3/3233* (2016.01)
 *G09G 3/3291* (2016.01)
 *H03K 17/687* (2006.01)
 *G09G 3/3266* (2016.01)

(52) U.S. Cl.
 CPC ......... *G09G 3/3233* (2013.01); *G09G 3/3266* (2013.01); *G09G 3/3291* (2013.01); *H03K 17/687* (2013.01); *G09G 2300/0809* (2013.01); *G09G 2300/0861* (2013.01); *G09G 2310/0286* (2013.01); *G09G 2310/08* (2013.01); *G09G 2320/064* (2013.01)

(58) Field of Classification Search
 CPC ......... G09G 3/3266; G09G 2310/0286; G09G 2300/0861
 See application file for complete search history.

(56) References Cited

U.S. PATENT DOCUMENTS

| | | | |
|---|---|---|---|
| 2012/0081409 A1* | 4/2012 | Chung | G09G 3/3266 345/690 |
| 2014/0055444 A1* | 2/2014 | Jang | G09G 3/3291 345/213 |

FOREIGN PATENT DOCUMENTS

| | | |
|---|---|---|
| KR | 10-2013-0074567 A | 7/2013 |
| KR | 10-2014-0025149 A | 3/2014 |

* cited by examiner

*Primary Examiner* — Xuemei Zheng
(74) *Attorney, Agent, or Firm* — Lee & Morse P.C.

(57) ABSTRACT

An emission driver includes a plurality of circuit stages to output emission control signals. Each circuit stage includes signal generators, a pull-up controller to control a pull-up circuit, and a pull-down controller to control a pull-down circuit. One signal generator generates node signals based on a carry signal and a second clock signal. Another signal generator generates a first clock signal delayed from the second clock signal and another node signal. The pull-up circuit pulls up an emission control signal to a first driving voltage based on some of the node signals. The pull-down circuit pulls down the emission control signal to a second driving voltage lower than the first driving voltage. The pull-down controller control the pull-down circuit based on delayed dimming clock signals.

22 Claims, 7 Drawing Sheets

| | | t1 | t2 | t3 | t4 | t5 | t6 | t7 |
|---|---|---|---|---|---|---|---|---|
| Q NODE | VOLTAGE | L | L | VL | L | L | H | H |
| | INFLUENCE FACTOR | HOLD(C1) | HOLD(C1) | COUPLING (C1) | HOLD(C1) | HOLD(C1) | FLM(M8) | HOLD(C1) |
| SR_Q NODE | VOLTAGE | L | L | L | L | L | H | H |
| | INFLUENCE FACTOR | FLM(M1) | HOLD(C4) | HOLD(C4) | HOLD(C4) | HOLD(C4) | FLM(M1) | FLM(M1) |
| SR_QB NODE | VOLTAGE | L | H | H | H | H | L | L |
| | INFLUENCE FACTOR | CLK2(M2) VGL(M3) | CLK2(M2) | CLK2(M2) | CLK2(M2) | CLK2(M2) | VGL(M3) | VGL(M3) |
| QB NODE | VOLTAGE | H | H | H | H | H | H | H |
| | INFLUENCE FACTOR | VGH(M7) | VGH(M7) | VGH(M7) | VGH(M7) | VGH(M7) | HOLD(C3) | HOLD(C3) |

FIG. 6B

| | | t8 | t9 | t10 | t11 | t12 | t13 | t14 |
|---|---|---|---|---|---|---|---|---|
| Q NODE | VOLTAGE | H | H | H | H | L | L | VL |
| | INFLUENCE FACTOR | HOLD(C1) | VGM(M6) | VGM(M6) | VGH(M6) | FLM(M8) | HOLD(C1) | COUPLING (C1) |
| SR_Q NODE | VOLTAGE | H | H | H | H | L | L | L |
| | INFLUENCE FACTOR | HOLD(C4) | HOLD(C4) | HOLD(C4) | HOLD(C4) | FLM(M1) | FLM(M1) | HOLD(C4) |
| SR_QB NODE | VOLTAGE | L | VL | VL | L | L | L | H |
| | INFLUENCE FACTOR | VGL(M3) | COUPLING (C2) | HOLD(C2) | HOLD(C2) | CLK2(M2) VGL(M3) | CLK2(M2) VGL(M3) | CLK2(M2) |
| QB NODE | VOLTAGE | H | L | L | L | H | H | H |
| | INFLUENCE FACTOR | HOLD(C3) | CLK1(M4) | CLK1(M4) | CLK1(M4) | VGH(M7) | VGH(M7) | VGH(M7) | and a pulse width greater than the first and second clock signals.

EMISSION DRIVER AND DISPLAY DEVICE INCLUDING THE SAME

CROSS-REFERENCE TO RELATED APPLICATION

Korean Patent Application No. 10-2016-0041595, filed on Apr. 5, 2016, and entitled, "Emission Driver and Display Device Including the Same," is incorporated by reference herein in its entirety.

BACKGROUND

1. Field

One or more embodiments described herein relate to an emission driver and a display device including an emission driver.

2. Description of the Related Art

An organic light emitting display is used in many electronic devices. Various techniques have been proposed for driving such a display. Examples include progressive emission technique and simultaneous emission technique. A progressive emission technique sequentially performs a scan operation on pixels in scan line units, and then sequentially performs an emission operation on pixels in emission line units. A simultaneous emission technique sequentially performs a scan operation on pixels in scan line units, and then simultaneously performs an emission operation on the pixels.

The structure of the display is determined based on which driving technique is used. For example, the structure of the emission driving unit in an organic light emitting display employing an progressive emission technique may allow emission control signals to be sequentially provided to a display panel. The structure of an emission driving unit in the organic light emitting display device employing a simultaneous emission technique may allow emission control signals to be simultaneously provided to a display panel.

SUMMARY

In accordance with one or more embodiments, an emission driver includes a plurality of circuit stages to output a plurality of emission control signals, each of the circuit stages including: a first signal generator to generate a first node signal of a first node and a second node signal of a second node based on a carry signal and a second clock signal; a second signal generator to generate a first clock signal delayed from the second clock signal and a third node signal of a third node based on the first and second node signals; a pull-up circuit to pull up an emission control signal to a first driving voltage based on the third node signal; a pull-up controller to control the third node signal based on a fourth node signal of a fourth node; a pull-down circuit to pull down the emission control signal to a second driving voltage lower than the first driving voltage based on the fourth node signal; and a first pull-down controller to control the fourth node signal based on a first dimming clock signal and a second dimming clock signal delayed from the first dimming clock signal.

The circuit stage may include a second pull-down controller to control the fourth node signal based on the third node signal. The first and second dimming clock signals may have a repetitive period corresponding to two horizontal periods and a pulse width greater than the first and second clock signals.

The first pull-down controller may include a first transistor including a control electrode to receive the second dimming clock signal, an input electrode to receive the carry electrode, and an output electrode connected to the fourth node; a first capacitor including a first electrode connected to the fourth node; a second transistor including a control electrode connected to the third node, an input electrode to receive the first driving voltage, and an output electrode connected to a second electrode of the first capacitor; and a third transistor with a control electrode connected to the fourth node, an input electrode to receive the first dimming clock signal, and an output electrode connected to the second electrode of the first capacitor. The first pull-down controller may include a second capacitor with a first electrode to receive the first driving voltage and a second electrode connected to the second electrode of the first capacitor.

The first signal generator may include a first transistor including a control electrode to receive the second clock signal, an input electrode to receive the carry signal, and an output electrode connected to the first node; a second transistor including a control electrode connected to the first node, an input electrode to receive the second clock signal, and an output electrode connected to the second node; a third transistor including a control electrode to receive the second clock signal, an input electrode to receive the second driving voltage, and an output electrode connected to the second node; and a first capacitor including a first electrode connected to the first node and a second electrode receiving the first driving voltage.

The second signal generator may include a second capacitor; a fourth transistor including a control electrode connected to the second node, an input electrode to receive the first clock signal, and an output electrode connected to the first electrode of the second capacitor; and a fifth transistor including a control electrode to receive the first clock signal, an input electrode connected to the second electrode of the second capacitor, and an output electrode connected to the third node.

The pull-down circuit may include a transistor with a control electrode connected to the fourth node, an input electrode receiving the second driving voltage, and an output electrode connected to an output terminal to output the emission control signal.

The pull-up circuit may include a transistor including a control electrode connected to the third node, an input electrode to receive the first driving voltage, and an output electrode connected to an output terminal to output the emission control signal; and a capacitor including a first electrode to receive the first driving voltage and a second electrode connected to the third node. The pull-up circuit may include a transistor including a control electrode connected to the fourth node, an input electrode to receive the first driving voltage, and an output electrode connected to the third node.

In accordance with one or more other embodiments, a display apparatus includes a display panel including a pixel which includes an organic light emitting diode and an emission control transistor to drive the organic light emitting diode; a timing controller to generate a first clock signal, a second clock signal delayed from the first clock signal, a first dimming clock signal, and a second dimming clock signal delayed from the first dimming clock signal; an emission driver to output an emission control signal to the emission control transistor, control a rising period of the emission control signal based on the first and second clock signals, and control a falling period of the emission control signal based on the first and second dimming clock signals, wherein the emission driver includes a plurality of circuit stages and where each of the circuit stages includes: a first signal generator to generate a first node signal of a first node and a second node signal of a second node based on a carry signal and a second clock signal; a second signal generator to generate a first clock signal delayed from the second clock signal and a third node signal of a third node based on the first and second node signals; a pull-up circuit to pull up an emission control signal to a first driving voltage based on the third node signal; a pull-up controller to control the signal of the third node based on a fourth node signal of a fourth node; a pull-down circuit to pull down the emission control signal to a second driving voltage lower than the first driving voltage based on the fourth node signal; and a first pull-down controller to control the fourth node signal based on a first dimming clock signal and a second dimming clock signal delayed from the first dimming clock signal.

The circuit stage may includes a second pull-down controller to control the fourth node signal based on the third node signal. The first and second dimming clock signals may have a repetitive period corresponding to two horizontal periods and a pulse width greater than the first and second clock signals.

The first pull-down controller may include a first transistor including a control electrode to receive the second dimming clock signal, an input electrode receiving the carry electrode, and an output electrode connected to the fourth node; a first capacitor including a first electrode connected to the fourth node; a second transistor including a control electrode connected to the third node, an input electrode to receive the first driving voltage, and an output electrode connected to a second electrode of the first capacitor; and a third transistor circuit including a control electrode connected to the fourth node, an input electrode to receive the first dimming clock signal, and an output electrode connected to the second electrode of the first capacitor. The first pull-down controller may include a second capacitor with a first electrode receiving the first driving voltage and a second electrode connected to the second electrode of the first capacitor.

The first signal generator may include a first transistor including a control electrode to receive the second clock signal, an input electrode to receive the carry signal, and an output electrode connected to the first node; a second transistor including a control electrode connected to the first node, an input electrode to receive the second clock signal, and an output electrode connected to the second node; a third transistor including a control electrode to receive the second clock signal, an input electrode to receive the second driving voltage, and an output electrode connected to the second node; and a first capacitor including a first electrode connected to the first node and a second electrode to receive the first driving voltage.

The second signal generator may include a second capacitor; a fourth transistor including a control electrode connected to the second node, an input electrode to receive the first clock signal, and an output electrode connected to the first electrode of the second capacitor; and a fifth transistor including a control electrode to receive the first clock signal, an input electrode connected to the second electrode of the second capacitor, and an output electrode connected to the third node.

The pull-down circuit may include a transistor with a control electrode connected to the fourth node, an input electrode to receive the second driving voltage, and an output electrode connected to an output terminal outputting the emission control signal.

The pull-up circuit may include a transistor including a control electrode connected to the third node, an input electrode to receive the first driving voltage, and an output electrode connected to an output terminal outputting the emission control signal; and a capacitor including a first electrode to receive the first driving voltage and a second electrode connected to the third node.

The pull-up controller may include a transistor including a control electrode connected to the fourth node, an input electrode to receive the first driving voltage, and an output electrode connected to the third node.

BRIEF DESCRIPTION OF THE DRAWINGS

Features will become apparent to those of skill in the art by describing in detail exemplary embodiments with reference to the attached drawings in which.

DETAILED DESCRIPTION

Example embodiments will be described with reference to the drawings; however, they may be embodied in different forms and should not be construed as limited to the embodiments set forth herein. Rather, these embodiments are provided so that this disclosure will be thorough and complete, and will fully convey exemplary implementations to those skilled in the art. The embodiments (or portions thereof) may be combined to form additional embodiments.

In the drawings, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

When an element is referred to as being "connected" or "coupled" to another element, it can be directly connected or coupled to the another element or be indirectly connected or coupled to the another element with one or more intervening elements interposed therebetween. In addition, when an element is referred to as "including" a component, this indicates that the element may further include another component instead of excluding another component unless there is different disclosure.

Figure 1:
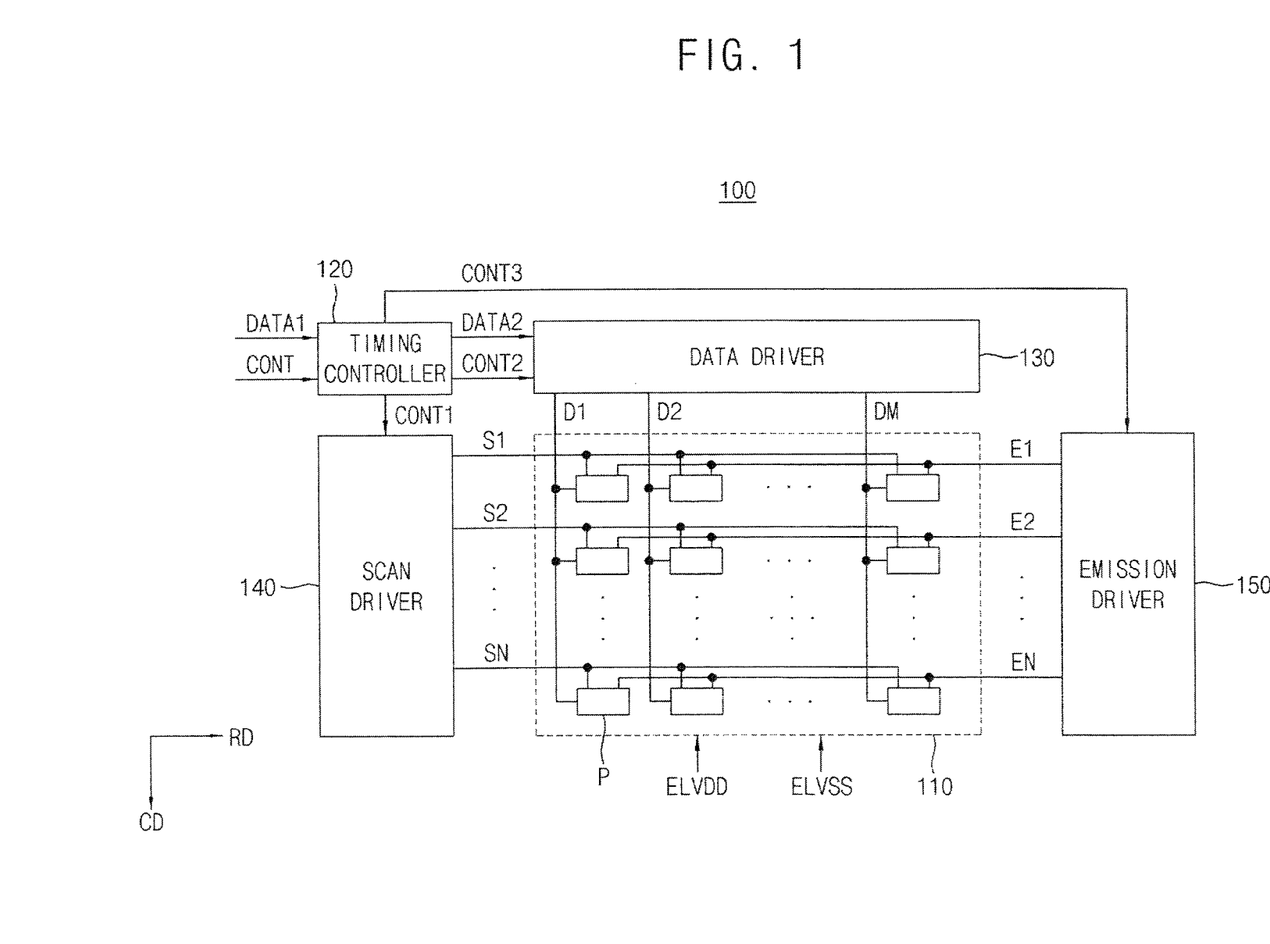
FIG. 1 illustrates an embodiment of a display apparatus.

FIG. 1 illustrates an embodiment of a display apparatus 100 which may include a display panel 110, a timing controller 120, a scan driver 130, a data driver 140 and an emission driver 150. The display panel 110 may include a plurality of pixels P, a plurality of scan lines S1, . . . , SN, a plurality of data lines D1, . . . , DM and a plurality of emission control lines E1, . . . , EN, where N and M are natural numbers. The pixels P may be arranged in a matrix that includes a plurality of rows and columns. Each pixel P may be connected to a scan line, a data line, and an emission control line.

The scan lines S1, . . . , SN may extend in a row direction RD and may be arranged in a column direction CD. The scan lines S1, . . . , SN are connected to the scan driver 140 and transfer scan signals to the pixels P.

The data lines D1, . . . , DM may extend in the column direction CD and may be arranged in the row direction RD. The data lines D1, . . . , DM are connected to the data driver 130 and transfer data voltages to the pixels P.

The emission control lines E1, . . . , EN may extend in the row direction RD and may be arranged in the column direction CD. The emission control lines E1, . . . , EN are connected to emission driver 150 and transfer emission control signals to the pixels P.

The pixels P may also receive a first emission power voltage ELVDD and second emission power voltage ELVSS. Each pixel P may receive a data voltage based on the scan signal and emit light with a luminance corresponding to the data voltage based on the first and second emission power voltages ELVDD and ELVSS.

The timing controller 120 may receive an image signal DATA1 and a control signal CONT from an external device. The image signal DATA1 may include color (e.g., red, green and blue) data. The control signal CONT may include a horizontal synchronization signal Hsync, a vertical synchronization signal Vsync, a main clock signal MCLK, and/or one or more other signals.

The timing controller 120 may convert the image signal DATA1 to image data DATA2 based on pixel structure, resolution of the display panel 110, and/or one or more other considerations. In one embodiment, the timing controller 120 may generate a first control signal CONT1 for driving the data driver 130, a second control signal CONT2 for driving the scan driver 140, and a third control signal CONT3 for driving the emission driver 150 based on the control signal CONT.

The data driver 130 may convert the image data DATA2 to a data voltage based on the first control signal CONT1, and output the data voltage to data lines D1, . . . , DM.

The scan driver 140 may generate scan signals based on the second control signal CONT2. The scan driver 140 may sequentially output the scan signals S1, . . . , SN along the column direction CD.

The emission driver 150 may generate emission control signals based on the third control signal CONT3. The third control signal CONT3 may include, for example, a start control signal FLM, a first clock signal CLK1, a second clock signal CLK2, a first dimming clock signal D_CLK1, and a second dimming clock signal D_CLK2. In addition, the emission driver 150 may receive a first driving voltage VGH and a second driving voltage VGL lower than the first driving voltage VGH, and may generate the emission control signals based on the first and second driving voltages VGH and VGL.

The emission driver 150 may start an operation based on the start control signal FLM, control a rising period of the emission control signal based on the first and second clock signals CLK1 and CLK2, and control a falling period of the emission control signal based on the first and second dimming clock signals D_CLK1 and D_CLK2.

According to the exemplary embodiment, each emission control signal may have a pulse width that is adjusted according to a delay difference between the first and second dimming clock signals D_CLK1 and D_CLK2. Thus, the luminance level of an image displayed on the display panel 110 may be finely adjusted.

Figure 2:
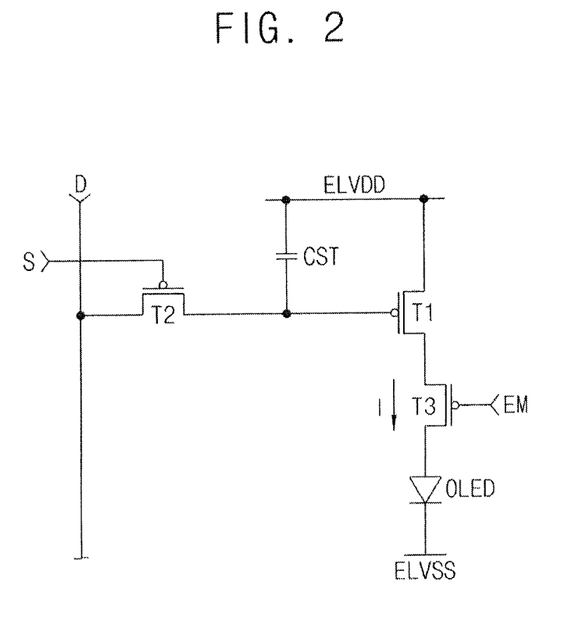
FIG. 2 illustrates an embodiment of a pixel.

FIG. 2 illustrates an embodiment of a pixel P which may include an organic light emitting diode OLED, a driving transistor T1, a capacitor CST, a switching transistor T2 and an emission control transistor T3. The driving transistor T1 includes a control electrode connected to the switching transistor T2, a first electrode receiving the first emission power voltage ELVDD, and a second electrode connected to the emission control transistor T3.

The capacitor CST includes a first electrode receiving the first emission power voltage ELVDD and a second electrode connected to the control electrode of the driving transistor T1.

The switching transistor T2 includes a control electrode receiving a scan signal S, a first electrode receiving a data voltage D, and a second electrode connected to the control electrode of the driving transistor T1.

The emission control transistor T3 includes a control electrode receiving an emission control signal EM, a first electrode connected to the driving transistor T1, and a second electrode connected to the organic light emitting diode OLED.

The organic light emitting diode OLED includes a first electrode connected to the emission control transistor T3 and a second electrode receiving the second emission power voltage ELVSS. When the emission control transistor T3 is turned on, a current I passing through the driving transistor T1 is applied to the organic light emitting diode OLED and the organic light emitting diode OLED emits light. The emission period of the organic light emitting diode OLED may be based on the turn-on period of the emission control transistor T3.

According to the exemplary embodiment, the pulse width of the emission control signal (which controls the turn-on period of the emission control transistor T3) may be adjusted. As a result, the luminance of light emitted from the organic light emitting diode OLED may be adjusted.

Figure 3:
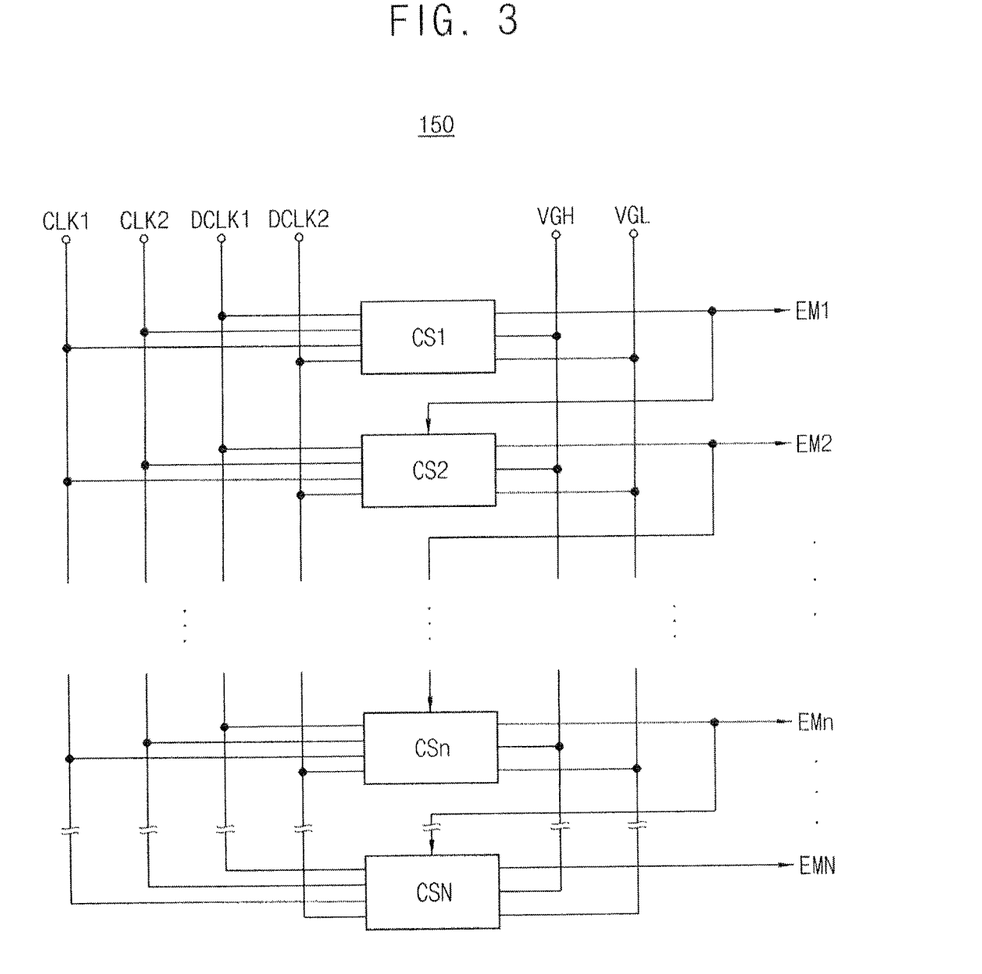
FIG. 3 illustrates an embodiment of an emission driver.

FIG. 3 illustrates an embodiment of the emission driver 150 which may include a plurality of circuit stages CS1, . . . , CSn, . . . , CSN that sequentially output emission control signals. The circuit stages CS1, . . . , CSn, . . . , CSN may receive a start control signal FLM, a first driving voltage VGL, a second driving voltage VGH, a first clock signal CLK1, a second clock signal CLK2, a first dimming clock signal D_CLK1, and a second dimming clock signal D_CLK2.

The start control signal FLM is applied to a first circuit stage CS1 among the circuit stages CS1, . . . , CSn, . . . , CSN. For example, the first circuit stage CS1 may receive the start control signal FLM, start an operation based on the start control signal FLM, and output a first emission control signal EM1. The first emission control signal EM1 output from the first circuit stage CS1 is applied to a second circuit stage CS2 (e.g., a next stage) as a start control signal of the second circuit stage CS2. Thus, the second pixel stage CS2 may output a second emission control signal EM2.

The first driving voltage VGH may have a high voltage H higher than the second driving voltage VGL. The first and second driving voltages VGH and VGL may be commonly applied to the circuit stages CS1, . . . , CSn, . . . , CSN.

The first clock signal CLK1 may have a repetitive period corresponding to two horizontal periods 2H and a first pulse width. For example, the first clock signal CLK1 may control the rising period of an odd numbered emission control signal generated from an odd numbered circuit stage among the circuit stages CS1, ..., CSn, ..., CSN.

The second clock signal CLK2 may be delayed by a predetermined period (e.g., one horizontal period 1H) from the first clock signal CLK1. The second clock signal CLK2 may have a repetitive period corresponding to two horizontal periods 2H and the first pulse width. The second clock signal CLK2 may control the rising period of an even numbered emission control signal generated from an even numbered circuit stage among the circuit stages CS1, ..., CSn, ..., CSN.

The first dimming clock signal D_CLK1 may have a repetitive period corresponding to two horizontal periods 2H and may have a second pulse width larger than the first pulse width. The first dimming clock signal D_CLK1 may be synchronized with the first clock signal CLK1 or delayed from the first clock signal CLK1.

The second dimming clock signal D_CLK2 may have a repetitive period corresponding to two horizontal periods 2H and the second pulse width. The second dimming clock signal D_CLK2 may be delayed from the first dimming clock signal D_CLK1. The second dimming clock signal D_CLK2 may be synchronized with the second clock signal CLK2 or delayed from the second clock signal CLK2.

The first and second dimming clock signals D_CLK1 and D_CLK2 may control a falling period of the emission control signals generated from the circuit stages CS1, ..., CSn, ..., CSN. As described above, the circuit stages CS1, ..., CSn, ..., CSN may sequentially output first to N-th emission control signals EM1, EM2, ..., EM.

According to the exemplary embodiment, the pulse width of the first to N-th emission control signals EM1, EM2, ..., EMN output from the circuit stages CS1, ..., CSn, ..., CSN may be adjusted by a delay difference between the first and second dimming clock signals D_CLK1 and D_CLK2. For example, when the display panel includes 400 horizontal lines and a delay difference between the first and second dimming clock signals D_CLK1 and D_CLK2 is a one horizontal period 1H, the luminance of the display panel may be adjusted by 400 luminance levels. Thus, the luminance may be finely adjusted.

Figure 4:
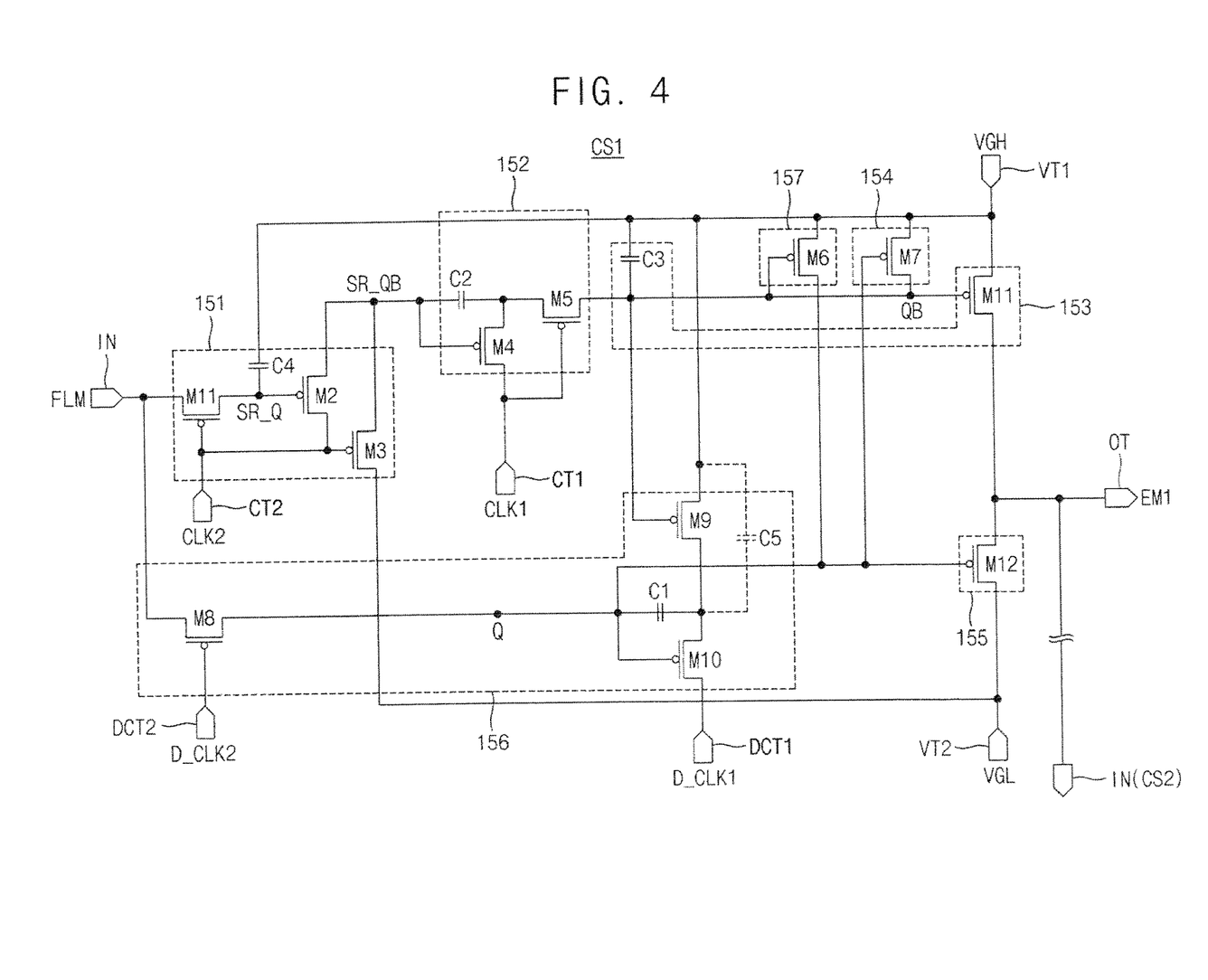
FIG. 4 illustrates an embodiment of a circuit stage.

FIG. 4 illustrates an embodiment of a circuit stage which may include an input terminal IN, a first clock terminal CT1, a second clock terminal CT2, a first dimming clock terminal DCT1, a second dimming clock terminal DCT2, a first driving voltage terminal VT1, a second driving voltage terminal VT2 and an output terminal OT.

The input terminal IN may receive a carry signal, which, for example, may be a start control signal from a timing controller or an output signal from a previous circuit stage. The first clock terminal CT1 may receive a first clock signal. The second clock terminal CT2 may receive a second clock signal delayed from the first clock signal.

The first dimming clock terminal DCT1 may receive a first dimming clock signal. The second dimming clock terminal DCT2 may receive a second dimming clock signal delayed by a delay difference DD from the first dimming clock signal.

The first driving voltage terminal VT1 may receive a first driving voltage VGH, the second driving voltage terminal VT2 may receive a second driving voltage VGL, and the output terminal OT may output an emission control signal as an output signal.

Referring to a first circuit stage CS1, the input terminal IN may receive the start control signal FLM corresponding to the carry signal. The first clock terminal CT1 may receive the first clock signal CLK1. The second clock terminal CT2 may receive the second clock signal CLK2. The first dimming clock terminal DCT1 may receive the first dimming clock signal D_CLK1. The second dimming clock terminal DCT2 may receive the second dimming clock signal D_CLK2. The first driving voltage terminal VT1 may receive the first driving voltage VGH. The second driving voltage terminal VT2 may receive the second driving voltage VGL. The output terminal OT may output a first emission control signal EM1.

Referring to a second circuit stage CS2, input terminal IN may receive the first emission control signal EM1, which is the carry signal, output from the first circuit stage CS1 of a previous circuit stage. The first clock terminal CT1 may receive the second clock signal CLK2 The second clock terminal CT2 may receive the first clock signal CLK1. The first dimming clock terminal DCT1 may receive the second dimming clock signal D_CLK2. The second dimming clock terminal DCT2 may receive the first dimming clock signal D_CLK1. The first driving voltage terminal VT1 may receive the first driving voltage VGH. The second driving voltage terminal VT2 may receive the second driving voltage VGL. The output terminal OT may output a second emission control signal EM2.

As described above, referring to the odd-numbered circuit stage, the first clock terminal CT1 may receive the first clock signal CLK1, the second clock terminal CT2 may receive the second clock signal CLK2, the first dimming clock terminal DCT1 may receive the first dimming clock signal D_CLK1, and the second dimming clock terminal DCT2 may receive the second dimming clock signal D_CLK2. Referring to the even numbered circuit stage, the first clock terminal CT1 may receive the second clock signal CLK2, the second clock terminal CT2 may receive the first clock signal CLK1, the first dimming clock terminal DCT1 may receive the second dimming clock signal D_CLK2, and the second dimming clock terminal DCT2 may receive the first dimming clock signal D_CLK1.

The first circuit stage CS1 may include a first signal generator 151, a second signal generator 152, a pull-up part 153, a pull-up control part 154, a pull-down part 155, a first pull-down control part 156, and a second pull-down control part 157.

The first signal generator 151 may include a first transistor M1, a second transistor M2, a third transistor M3, and a fourth capacitor C4. The first signal generator 151 may generate a first node signal of a first node SR_Q and a second node signal of a second node SR_QB based on the start control signal from the input terminal IN and the second clock signal CLK2 from the second clock terminal CT2.

The first transistor M1 includes a control electrode connected to the second clock terminal CT2, an input electrode connected to the input terminal IN, and an output electrode connected to the first node SR_Q.

The second transistor M2 includes a control electrode connected to the first node SR_Q, an input electrode connected to the second clock terminal CT2, and an output electrode connected to the second node SR_QB.

The third transistor M3 includes a control electrode connected to the second clock terminal CT2, an input electrode connected to the second driving voltage terminal VT2, and an output electrode connected to the second node SR_QB.

The fourth capacitor C4 includes a first electrode connected to the first node SR_Q and a second electrode connected to the first driving voltage terminal VT1, and may hold a voltage applied to the first node SR_Q.

The second signal generator 152 may include a fourth transistor M4, a fifth transistor M5, and a second capacitor C2.

The second signal generator 152 may generate a third node signal of a third node QB based on the second node signal of the second node SR_QB, and the first clock signal CLK2 from the first clock terminal CT1.

The fourth transistor M4 includes a control electrode connected to the second node SR_QB, an input electrode connected to the first clock terminal CT1, and an output electrode connected to the first electrode of the second capacitor C1.

The fifth transistor M5 includes a control electrode connected to the first clock terminal CT1, an input electrode connected to the second electrode of the second capacitor C2, and an output electrode connected to the third node QB.

The second capacitor C2 includes a first electrode connected to the second node SR_QB and a second electrode connected to the fourth and fifth transistors M4 and M5, and may hold a voltage applied to the second node SR_QB.

The pull-up part 153 may include an eleventh transistor M11 and a third capacitor C3. The pull-up part 153 may pull up the first emission control signal (that is the output signal) to a high voltage H based on the third node signal of the third node QB. The pull-up part 153 may control the rising period of the first emission control signal EM1.

The eleventh transistor M11 includes a control electrode connected to the third node QB, an input electrode connected to the first driving voltage terminal VT1, and an output electrode connected to the output terminal OT.

The third capacitor C3 includes a first electrode connected to the first node SR_Q and a second electrode connected to the third node QB, and may hold a voltage applied to the third node QB.

The pull-up control part 154 may control the third node signal of the third node QB based on a fourth node signal of a fourth node Q. The pull-up control part 154 may control the pull-up part 153. The pull-up control part 154 may include a seventh transistor M7 having a control electrode connected to the fourth node Q, an input electrode connected to the first driving voltage terminal VT1, and an output electrode connected to the third node QB.

The pull-down part 155 may pull down the first emission control signal (that is the output signal) to the low voltage L based on the first node signal of the fourth node Q. The pull-down part 155 may operate in correspondence with the falling period of the first emission control signal EM1. The pull-down part 155 may include a twelfth transistor M12 having a control electrode connected to the fourth node Q, an input electrode connected to the second driving voltage terminal VT2, and an output electrode connected to the output terminal OT.

The first pull-down control part 156 may control the fourth node signal of the fourth node Q based on the first and second dimming clock signals D_CLK1 and D_CLK2, which have the delay difference DD from the first and second dimming clock terminals DCT1 and DCT2. The first pull-down control part 156 may control the pull-down part 155.

The first pull-down control part 156 may include an eighth transistor M8, a ninth transistor M9, a tenth transistor M10, and a first capacitor C1. The eighth transistor M8 includes a control electrode connected to the second dimming clock terminal DCT1, an input electrode connected to the input terminal IN, and an output electrode connected to the fourth node Q. The ninth transistor M9 includes a control electrode connected to the third node QB, an input electrode connected to the first driving voltage terminal VT1, and an output electrode connected to the second electrode of the first capacitor C1. The tenth transistor M10 includes a control electrode connected to the fourth node Q, an input electrode connected to the first dimming clock terminal DCT1, and an output electrode connected to the second electrode of the first capacitor. The first capacitor C1 includes a first electrode connected to the fourth node Q and a second electrode connected to the ninth and tenth transistors M9 and M10. The first capacitor C1 holds a voltage applied to the fourth node Q.

The first pull-down control part 156 may include a fifth capacitor C5, having a first electrode connected to the first driving voltage terminal VT1 and a second electrode connected to the second electrode of the first capacitor C1. The fifth capacitor C5 may stably hold a voltage applied to the fourth node Q.

The second pull-down control part 157 may control the fourth node signal of the fourth node Q based on the third signal of the third node QB. The second pull-down control part 157 may control the pull-down part 155. The second pull-down control part 157 may include a sixth transistor M6 having a control electrode connected to the third node QB, an input electrode connected to the first driving voltage terminal VT1, and an output electrode connected to the fourth node Q.

Figure 5:
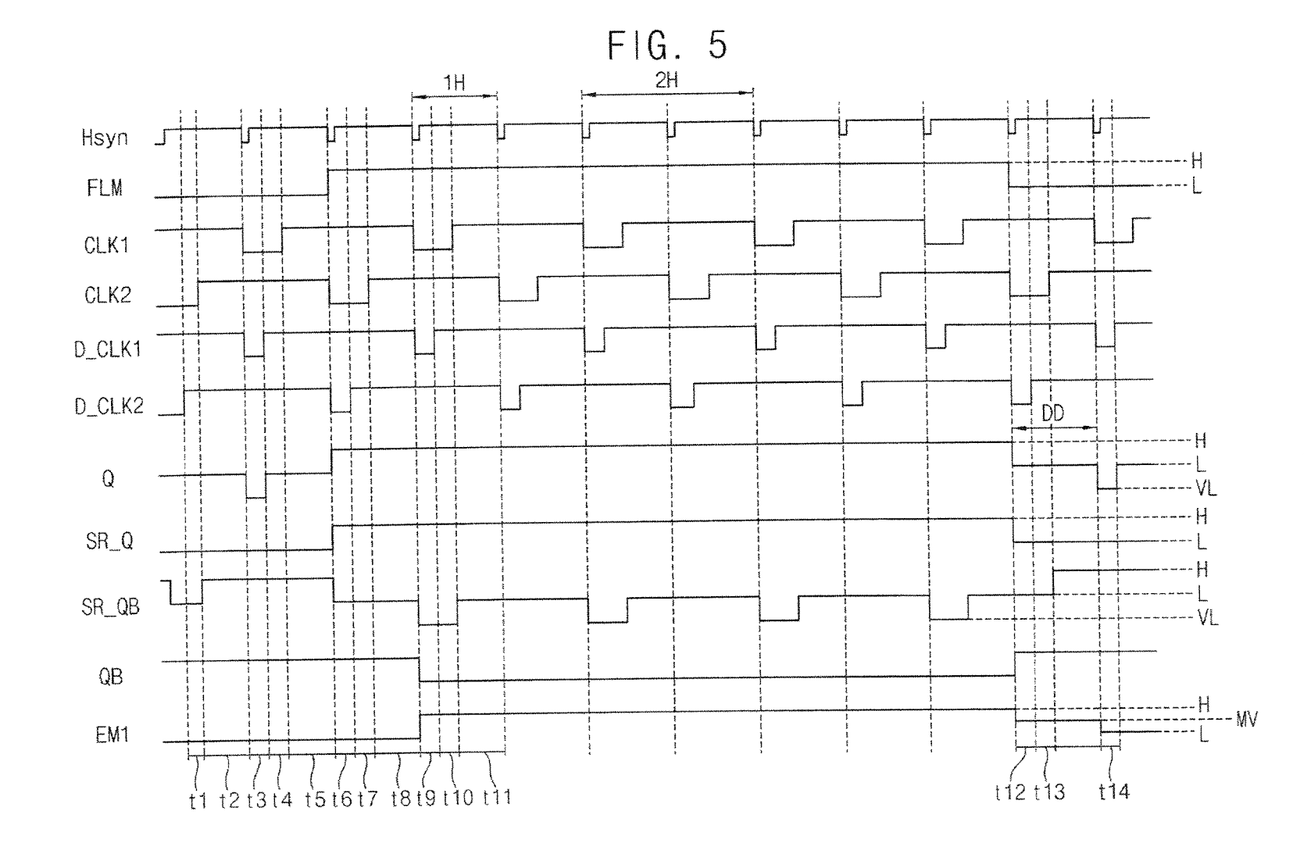
FIG. 5 illustrates an embodiment of a method for driving a circuit stage.
Figure 6A:
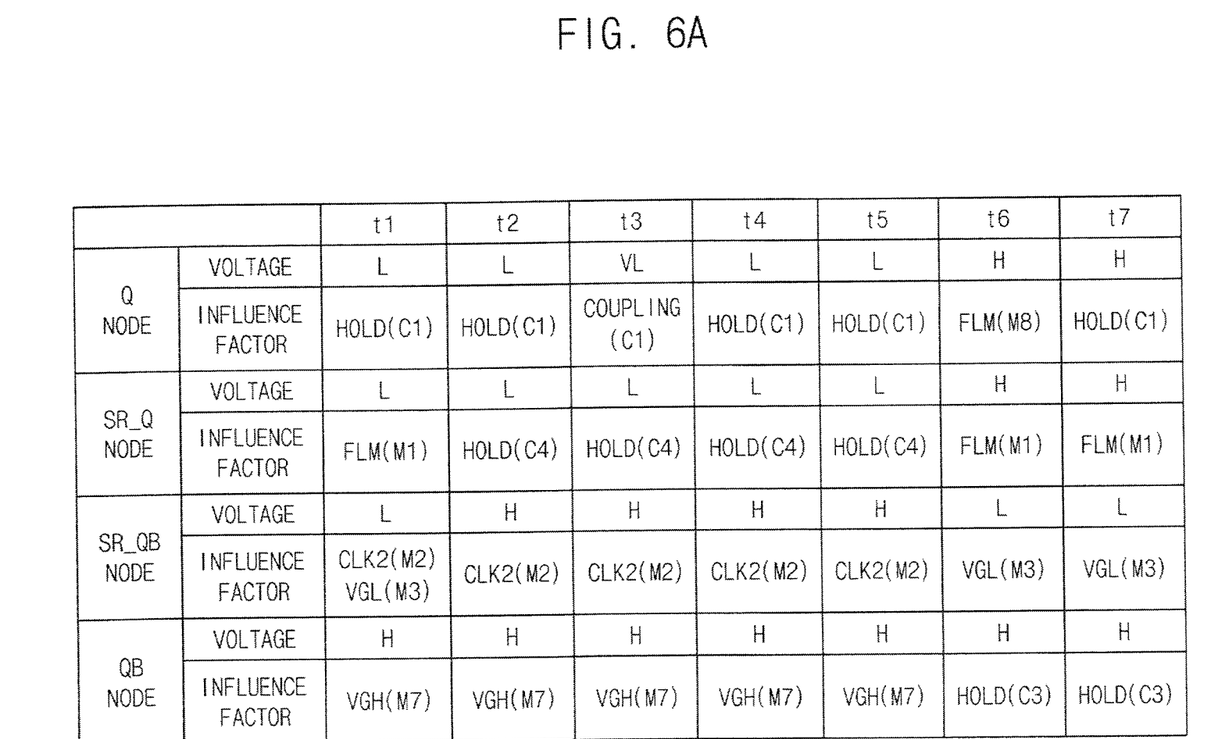
FIGS. 6A and 6B illustrate other embodiments for driving a circuit stage.
Figure 6B:
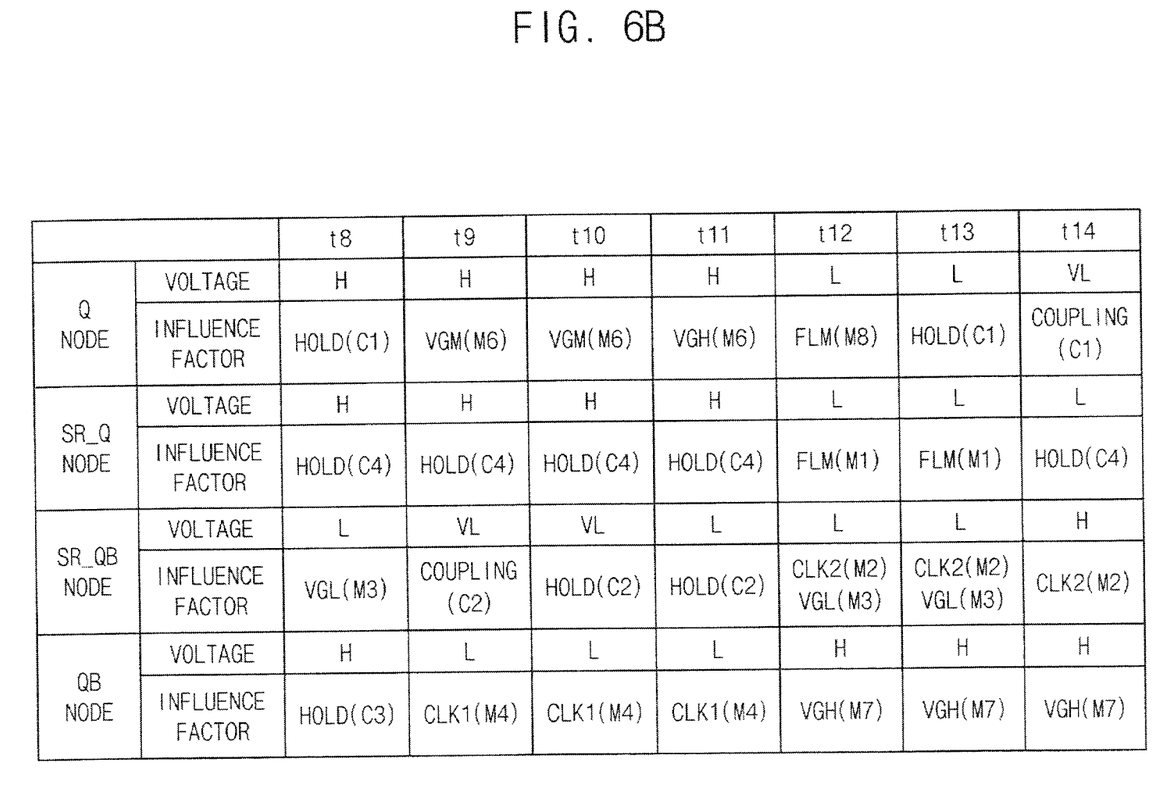

FIG. 5 illustrates a timing diagram corresponding to an embodiment of a method for driving the circuit stage. FIGS. 6A and 6B are examples of tables for the method of FIG. 5.

Referring to FIGS. 4, 5, 6A, and 6B, during a first period t1, a start control signal FLM has a low voltage L, a first clock signal CLK1 has a high voltage H, a second clock signal CLK2 has a low voltage L, a first dimming clock signal D_CLK1 has a high voltage H, and a second dimming clock signal D_CLK2 has a high voltage H.

The first transistor M1 is turned on, based on the low voltage L of the second clock signal CLK, to provide the first node SR_Q with the low voltage L of the start control signal FLM. The first node SR_Q has the low voltage L.

The second transistor M2 is turned on based on the low voltage L of the first node SR_Q. The third transistor M3 is turned on based on the low voltage L of the second clock signal CLK. The third transistor M3 provides the second node SR_QB with the low voltage L of the second driving voltage VGL. Thus, the second node SR_QB has the low voltage L.

The fourth transistor M4 is turned on based on the low voltage L of the second node SR_QB. The fifth transistor M5 is turned off based on the high voltage H of the first clock signal CLK1.

The eighth transistor M8 is turned off based on the high voltage H of the second dimming clock signal D_CLK2. The fourth node Q has the low voltage L which is applied during a previous period by the first capacitor C1.

The seventh transistor M7 is turned on based on the low voltage L of the fourth node Q. The seventh transistor M7 provides the third node QB with the high voltage H of the first driving voltage VGH. Thus, the third node QB has the high voltage H.

The sixth transistor M6 is turned off based on the high voltage H of the third node QB.

The ninth transistor M9 is turned off based on the high voltage H of the third node QB.

The tenth transistor M10 is turned on based on the low voltage L of the fourth node Q, and provides the first capacitor C1 with the high voltage H of the first dimming clock signal D_CLK1.

The eleventh transistor T11 is turned off based on the high voltage H of the third node QB. The twelfth transistor T12 is turned on based on the low voltage L of the fourth node Q. The twelfth transistor T12 provides the output terminal OT with the low voltage L of the second driving voltage VGL. Thus, the output terminal OT may output a low voltage L of the first emission control signal EM1.

During a second period t2, the start control signal FLM has the low voltage L, the first clock signal CLK1 has the high voltage H, the second clock signal CLK2 has the high voltage H, the first dimming clock signal D_CLK1 has the high voltage H, and the second dimming clock signal D_CLK2 has the high voltage H.

The first and third transistors M1 and M3 are turned off based on the high voltage H of the second clock signal CLK. The first node SR_Q has the low voltage L which is applied during a pervious period by the fourth capacitor C4.

The second transistor M2 is turned on based on the low voltage L of the first node SR_Q. The second transistor M2 provides the second node SR_QB with the high voltage H of the second clock signal CLK2. Thus, the second node SR_QB has the high voltage H.

The fourth transistor M4 is turned off based on the high voltage H of the second node SR_QB. The fifth transistor M5 is turned off based on the high voltage H of the first clock signal CLK1.

The eighth transistor M8 is turned off based on the high voltage H of the second dimming clock signal D_CLK2. The fourth node Q has the low voltage L which is applied during a previous period by the first capacitor C1.

The seventh transistor M7 is turned on based on the low voltage L of the fourth node Q. The seventh transistor M7 provides the third node QB with the high voltage H of the first driving voltage VGH. Thus, the third node QB has the high voltage H.

The sixth transistor M6 is turned off based on the high voltage H of the third node QB.

The ninth transistor M9 is turned off based on the high voltage H of the third node QB.

The tenth transistor M10 is turned on based on the low voltage L of the fourth node Q and the high voltage H of the first dimming clock signal D_CLK1 is applied to the first capacitor C1.

The eleventh transistor T11 is turned off based on the high voltage H of the third node QB. The twelfth transistor 112 is turned on based on the low voltage L of the fourth node Q. The twelfth transistor T12 provides the output terminal OT with the low voltage L of the second driving voltage VGL. Thus, the output terminal OT outputs the low voltage L of the first emission control signal EM1.

During a third period t3, the start control signal FLM has the low voltage L, the first clock signal CLK1 has the low voltage L, the second clock signal CLK2 has the high voltage H, the first dimming clock signal D_CLK1 has the low voltage L, and the second dimming clock signal D_CLK2 has the high voltage H.

The first and third transistors M1 and M3 are turned off based on the high voltage H of the second clock signal CLK. The first node SR_Q has the low voltage L which is applied during a pervious period by the fourth capacitor C4.

The second transistor M2 is turned on based on the low voltage L of the first node SR_Q. The third transistor M3 is turned off based on the high voltage H of the second clock signal CLK. The second transistor M2 provides the second node SR_QB with the high voltage H of the second clock signal CLK2.

The fourth transistor M4 is turned off based on the high voltage H of the second node SR_QB. The fifth transistor M5 is turned on based on the low voltage L of the first clock signal CLK1.

The eighth transistor M8 is turned off based on the high voltage H of the second dimming clock signal D_CLK2. The fourth node Q has the low voltage L which is applied during a previous period by the first capacitor C1.

The seventh transistor M7 is turned on based on the low voltage L of the fourth node Q. The seventh transistor M7 provides the third node QB with the high voltage H of the first driving voltage VGH. The third node QB has the high voltage H.

The sixth transistor M6 is turned off based on the high voltage H of the third node QB.

The ninth transistor M9 is turned off based on the high voltage H of the third node QB.

The tenth transistor M10 is turned on based on the low voltage L of the fourth node Q and the low voltage L of the first dimming clock signal D_CLK1 is applied to the first capacitor C1. The fourth node Q is coupled with the first capacitor C1, Thus, the voltage of the fourth node Q is dropped to a boosting voltage VL lower than the low voltage L according to bootstrapping by voltage regulation of the first dimming clock signal D_CLK1 applied to the first capacitor C1. The fourth node Q has the boosting voltage VL.

The eleventh transistor T11 is turned off based on the high voltage H of the third node QB. The twelfth transistor T12 is turned on based on the boosting voltage VL of the fourth node Q. The twelfth transistor T12 provides the output terminal OT with the low voltage L of the second driving voltage VGL. Thus, the output terminal OT outputs the low voltage L of the first emission control signal EM1.

During a fourth period t4, the start control signal FLM has the low voltage L, the first clock signal CLK1 has the low voltage L, the second clock signal CLK2 has the high voltage H, the first dimming clock signal D_CLK1 has the high voltage H, and the second dimming clock signal D_CLK2 has the high voltage H.

The first transistor M1 and third transistor M3 are turned off based on the high voltage H of the second clock signal CLK2. The first node SR_Q has the low voltage L which is applied during a pervious period by the fourth capacitor C4.

The second transistor M2 is turned on based on the low voltage L of the first node SR_Q. The third transistor M3 is turned off based on the high voltage H of the second clock signal CLK2. The second transistor M2 provides the second node SR_QB with the high voltage H of the second clock signal CLK2.

The fourth transistor M4 is turned off based on the high voltage H of the second node SR_QB. The fifth transistor M5 is turned on based on the low voltage L of the first clock signal CLK1.

The eighth transistor M8 is turned off based on the high voltage H of the second dimming clock signal D_CLK2. The fourth node Q has the low voltage L which is applied during a pervious period by the first capacitor C1.

The seventh transistor M7 is turned on based on the low voltage L of the fourth node Q. The seventh transistor M7 provides the third node QB with the high voltage H of the first driving voltage VGH. Thus, the third node QB has the high voltage H.

The sixth transistor M6 is turned off based on the high voltage H of the third node QB.

The ninth transistor M9 is turned off based on the high voltage H of the third node QB.

The tenth transistor M10 is turned on based on the low voltage L of the fourth node Q and the high voltage H of the first dimming clock signal D_CLK1 is applied to the first capacitor C1.

The eleventh transistor T11 is turned off based on the high voltage H of the third node QB. The twelfth transistor T12 is turned on based on the low voltage L of the fourth node Q. The twelfth transistor T12 provides the output terminal OT with the low voltage L of the second driving voltage VGL. Thus, the output terminal OT outputs the low voltage L of the first emission control signal EM1.

Methods of driving the circuit stage during a fifth period t5 are substantially the same as those during the second period t2. Thus, the first node SR_Q has the low voltage L, the second node SR_QB has the high voltage H, the third node QB has the high voltage H, and the fourth node Q has the low voltage L. During the fifth period t5, the output terminal OT outputs the low voltage L of the first emission control signal EM1.

During a sixth period t6, the start control signal FLM has the high voltage H, the first clock signal CLK1 has the high voltage H, the second clock signal CLK2 has the low voltage L, the first dimming clock signal D_CLK1 has the high voltage H, and the second dimming clock signal D_CLK2 has the low voltage L.

The first transistor M1 is turned on, based on the low voltage L of the second clock signal CLK, to provide the first node SR_Q with the high voltage H of the start control signal FLM. The first node SR_Q has the high voltage H. The high voltage H of the first node SR_Q is applied to the fourth capacitor C4.

The second transistor M2 is turned off based on the high voltage H of the first node SR_Q. The third transistor M3 is turned on based on the low voltage L of the second clock signal CLK. The third transistor M3 provides the second node SR_QB with the low voltage L of the second driving voltage VGL. Thus, the second node SR_QB has the low voltage L.

The fourth transistor M4 is turned on based on the low voltage L of the second node SR_QB. The fifth transistor M5 is turned off based on the high voltage H of the first clock signal CLK1.

The eighth transistor M8 is turned on, based on the low voltage L of the second dimming clock signal D_CLK2, to provide the fourth node Q with the high voltage H of the start control signal. Thus, the fourth node Q has the high voltage H.

The seventh transistor M7 is turned off based on the high voltage H of the fourth node Q. The third node QB has the high voltage H which is applied during a pervious period by the third capacitor C3.

The sixth transistor M6 is turned off based on the high voltage H of the third node QB.

The ninth transistor M9 is turned off based on the high voltage H of the third node QB.

The tenth transistor M10 is turned off based on the high voltage H of the fourth node Q.

The eleventh transistor T11 is turned off based on the high voltage H of the third node QB. The twelfth transistor T12 is turned off based on the high voltage H of the fourth node Q. Thus, the output terminal OT outputs the low voltage L of the first emission control signal EM1, which is output during a pervious period.

During a seventh period t7, the start control signal FLM has the high voltage H, the first clock signal CLK1 has the high voltage H, the second clock signal CLK2 has the low voltage L, the first dimming clock signal D_CLK1 has the high voltage H, and the second dimming clock signal D_CLK2 has the high voltage H.

The first transistor M1 is turned on, based on the low voltage L of the second clock signal CLK, to provide the first node SR_Q with the high voltage H of the start control signal FLM. Thus, the first node SR_Q has the high voltage H.

The second transistor M2 is turned off based on the high voltage H of the first node SR_Q. The third transistor M3 provides the second node SR_QB with the low voltage L of the second driving voltage VGL based on the low voltage L of the second clock signal CLK. Thus, the second node SR_QB has the low voltage L.

The fourth transistor M4 M1 is turned on based on the low voltage L of the second node SR_QB. The fifth transistor M5 is turned off based on the high voltage H of the first clock signal CLK1.

The eighth transistor M8 is turned off based on the high voltage H of the second dimming clock signal D_CLK2. The fourth node Q has the high voltage H applied during a pervious period by the first capacitor C1. In addition, when the fifth capacitor C5 is in the circuit stage, the high voltage H of fourth node Q may be stably maintained.

The seventh transistor M7 is turned off based on the high voltage H of the fourth node Q. The third node QB has the high voltage H applied during a pervious period by the third capacitor C3.

The sixth transistor M6 is turned off based on the high voltage H of the third node QB.

The ninth transistor M9 is turned off based on the high voltage H of the third node QB.

The tenth transistor M10 is turned off based on the high voltage H of the fourth node Q.

The eleventh transistor T11 is turned off based on the high voltage H of the third node QB. The twelfth transistor T12 is turned off based on the high voltage H of the fourth node Q. Thus, the output terminal OT outputs the low voltage L of the first emission control signal EM1, which is output during a pervious period.

During the eighth period t8, the start control signal FLM has the high voltage H, the first clock signal CLK1 has the high voltage H, the second clock signal CLK2 has the high voltage H, the first dimming clock signal D_CLK1 has the high voltage H, and the second dimming clock signal D_CLK2 has the high voltage H.

The first and third transistors M1 and M3 are turned off based on the high voltage H of the second clock signal CLK. The first node SR_Q has the high voltage H applied during a pervious period by the fourth capacitor C4.

The second transistor M2 is turned off based on the high voltage H of the first node SR_Q. The second node SR_QB has the low voltage L applied during a previous period by the second capacitor C2.

The fourth transistor M4 is turned on based on the low voltage L of the second node SR_QB. The fifth transistor M5 is turned off based on the high voltage H of the first clock signal CLK1.

The eighth transistor M8 is turned off based on the high voltage H of the second dimming clock signal D_CLK2. The fourth node Q has the high voltage H applied during a previous period by the first capacitor C1. In addition, when the fifth capacitor C5 is in the circuit stage, the high voltage H of fourth node Q may be stably maintained.

The seventh transistor M7 is turned off based on the high voltage H of the fourth node Q. The third node QB has the high voltage H applied during a pervious period by the third capacitor C3.

The sixth transistor M6 is turned off based on the high voltage H of the third node QB.

The ninth transistor M9 is turned off based on the high voltage H of the third node QB.

The tenth transistor M10 is turned off based on the high voltage H of the fourth node Q.

The eleventh transistor T11 is turned off based on the high voltage H of the third node QB. The twelfth transistor T12 is turned off based on the high voltage H of the fourth node Q. Thus, the output terminal OT outputs the low voltage L of the first emission control signal EM1, which is output during a pervious period.

During a ninth period t9, the start control signal FLM has the high voltage H, the first clock signal CLK1 has the low voltage L, the second clock signal CLK2 has the high voltage H, the first dimming clock signal D_CLK1 has the low voltage L, and the second dimming clock signal D_CLK2 has the high voltage H.

The first and third transistor M1 and M3 are turned off based on the high voltage H of the second clock signal CLK2. The first node SR_Q has the high voltage H applied during a pervious period by the fourth capacitor C4.

The second transistor M2 is turned off based on the high voltage H of the first node SR_Q. The second node SR_QB has the low voltage L applied during a pervious period by the second capacitor C2.

The fourth transistor M4 is turned on based on the low voltage L of the second node SR_QB. The fifth transistor M5 is turned on based on the low voltage L of the first clock signal CLK1.

The second node SR_QB is coupled with the second capacitor C2. Thus, a voltage of the second node SR_QB is dropped to a boosting voltage VL lower than the low voltage L according to bootstrapping by voltage regulation of the first clock signal CLK1 applied to the second capacitor C2. The second node SR_QB has the boosting voltage VL.

The fourth transistor M4 is turned on based on the boosting voltage VL of the second node SR_QB. The fifth transistor M5 is turned on based on the low voltage L of the first clock signal CLK1. The fourth and fifth transistors M4 and M5 provide the third node QB with the low voltage L of the first clock signal CLK1. Thus, the third node QB has the low voltage L.

The eighth transistor M8 is turned off based on the high voltage H of the second dimming clock signal D_CLK2.

The sixth transistor M6 is turned on, based on the low voltage L of the third node QB, to provide the fourth node Q with the high voltage H of the first driving voltage VGH. Thus, the fourth node Q has the high voltage H.

The seventh transistor M7 is turned on based on the low voltage L of the fourth node Q.

The ninth transistor M9 is turned on based on the low voltage L of the third node QB and the high voltage H of the first driving voltage VGH is applied to the first capacitor C1.

The tenth transistor M10 is turned on based on the low voltage L of the fourth node Q.

The eleventh transistor T11 is turned on based on the low voltage L of the third node QB. The twelfth transistor T12 is turned off based on the high voltage H of the fourth node Q. Thus, the output terminal OT outputs the high voltage H of the first emission control signal EM1, which is the high voltage H of first driving voltage VGH.

During a tenth period t10, the start control signal FLM has the high voltage H, the first clock signal CLK1 has the low voltage L, the second clock signal CLK2 has the high voltage H, the first dimming clock signal D_CLK1 has the high voltage H, and the second dimming clock signal D_CLK2 has the high voltage H.

The first and third transistors M1 and M3 are turned off based on the high voltage H of the second clock signal CLK2. The first node SR_Q has the high voltage H applied during a pervious period by the fourth capacitor C4.

The second transistor M2 is turned off based on the high voltage H of the first node SR_Q. The third transistor M3 is turned off based on the high voltage H of the second clock signal CLK. The first node SR_Q has the high voltage H applied during a pervious period by the fourth capacitor C4.

The second transistor M2 is turned off based on the high voltage H of the first node SR_Q. The second node SR_QB has the boosting voltage VL applied during a pervious period by the second capacitor C2.

The fourth transistor M4 is turned on based on the boosting voltage VL of the second node SR_QB. The fifth transistor M5 is turned on based on the low voltage L of the first clock signal CLK1. The fourth and fifth transistors M4 and M5 provide the third node QB with the low voltage L. Thus, the third node QB has the low voltage L.

The eighth transistor M8 is turned off based on the high voltage H of the second dimming clock signal D_CLK2.

The sixth transistor M6 is turned on, based on the low voltage L of the third node QB, to provide the fourth node Q with the high voltage H of the first driving voltage VGH. Thus, the fourth node Q has the high voltage H.

The seventh transistor M7 is turned off based on the high voltage H of the fourth node Q.

The ninth transistor M9 is turned on, based on the low voltage L of the third node QB, to provide the first capacitor C1 with the high voltage H of the first driving voltage VGH.

The tenth transistor M10 is turned off based on the high voltage H of the fourth node Q.

The eleventh transistor T11 is turned on based on the low voltage L of the third node QB. The twelfth transistor T12 is turned off based on the high voltage H of the fourth node Q. Thus, the output terminal OT outputs the high voltage H of the first emission control signal EM1, which is the high voltage H of first driving voltage VGH.

During an eleventh period t11, the start control signal FLM has the high voltage H, the first clock signal CLK1 has the high voltage H, the second clock signal CLK2 has the high voltage H, the first dimming clock signal D_CLK1 has the high voltage H, and the second dimming clock signal D_CLK2 has the high voltage H.

The first and third transistors M1 and M3 are turned off based on the high voltage H of the second clock signal CLK2. The first node SR_Q has the high voltage H applied during a pervious period by the fourth capacitor C4.

The second transistor M2 is turned off based on the high voltage H of the first node SR_Q. The second node SR_QB has the low voltage L applied during a pervious period by the second capacitor C2.

The fourth transistor M4 is turned on based on the low voltage L of the second node SR_QB. The fifth transistor M5 is turned on based on the low voltage L of the first clock signal CLK1.

The eighth transistor M8 is turned off based on the high voltage H of the second dimming clock signal D_CLK2. The fourth node Q has the high voltage H applied during a pervious period by the first capacitor C1.

The seventh transistor M7 is turned off based on the high voltage H of the fourth node Q. The third node QB has the low voltage L applied during a pervious period by the third capacitor C3.

The sixth transistor M6 is turned on, based on the low voltage L of the third node QB, to provide the fourth node Q with the high voltage H of the first driving voltage VGH. Thus, the fourth node Q has the high voltage H.

The seventh transistor M7 is turned off based on the high voltage H of the fourth node Q.

The ninth transistor M9 is turned on based on the low voltage L of the third node QB, and provides the first capacitor C1 with the high voltage H of the first driving voltage VGH.

The tenth transistor M10 is turned off based on the high voltage H of the fourth node Q.

The eleventh transistor T11 is turned on based on the low voltage L of the third node QB. The twelfth transistor T12 is turned off based on the high voltage H of the fourth node Q. Thus, the output terminal OT outputs the high voltage H of the first emission control signal EM1, which is the high voltage H of first driving voltage VGH.

During a twelfth period t12, the start control signal FLM has the low voltage L, the first clock signal CLK1 has the high voltage H, the second clock signal CLK2 has the low voltage L, the first dimming clock signal D_CLK1 has the high voltage H, and the second dimming clock signal D_CLK2 has the low voltage L.

The first transistor M1 is turned on, based on the low voltage L of the second clock signal CLK, to provide the first node SR_Q with the low voltage L of the start control signal FLM. Thus, the first node SR_Q has the low voltage L.

The second transistor M2 is turned on based on the low voltage L of the first node SR_Q. The third transistor M3 is turned on based on the low voltage L of the second clock signal CLK. The third transistor M3 provides the second node SR_QB with the low voltage L of the second driving voltage VGL. Thus, the second node SR_QB has the low voltage L.

The fourth transistor M4 is turned on based on the low voltage L of the second node SR_QB. The fifth transistor M5 is turned off based on the high voltage H of the first clock signal CLK1.

The eighth transistor M is turned on, based on the low voltage L of the second dimming clock signal D_CLK2, to provide the fourth node Q with the low voltage L of the start control signal. Thus, the fourth node Q has the low voltage L.

The seventh transistor M7 is turned on, based on the low voltage L of the fourth node Q, to provide the third node QB with the high voltage H of the first driving voltage VGH. Thus, the third node QB has the high voltage H.

The sixth transistor M6 is turned off based on the high voltage H of the third node QB.

The ninth transistor M9 is turned off based on the high voltage H of the third node QB.

The tenth transistor M10 is turned on, based on the low voltage L of the fourth node Q, to provide the first capacitor C1 with the high voltage H of the first dimming clock signal D_CLK1.

The eleventh transistor T11 is turned off based on the high voltage H of the third node QB. The twelfth transistor T12 is turned on based on the low voltage L of the fourth node Q.

The twelfth transistor M12 of a PMOS transistor is not completely turned on when a gate voltage that is the low voltage L of the fourth node Q is not a sufficient low voltage such as the boosting voltage VL. Thus, the output voltage of the twelfth transistor M12 has a middle voltage MV greater than the low voltage L by a threshold voltage of the twelfth transistor M12. Thus, the output terminal OT outputs the middle voltage MV, which is the output voltage of the twelfth transistor M12.

Therefore, the output terminal OT outputs the middle voltage MV of the first emission control signal EM1.

During a first 3 period t13, the start control signal FLM has the low voltage L, the first clock signal CLK1 has the high voltage H, the second clock signal CLK2 has the low voltage L, the first dimming clock signal D_CLK1 has the high voltage H, and the second dimming clock signal D_CLK2 has the high voltage H.

The first transistor M1 is turned on, based on the low voltage L of the second clock signal CLK, to provide the first node SR_Q with the low voltage L of the start control signal FLM. Thus, the first node SR_Q has the low voltage L.

The second transistor M2 is turned on based on the low voltage L of the first node SR_Q. The third transistor M3 is turned on based on the low voltage L of the second clock signal CLK. The third transistor M3 provides the second node SR_QB with the low voltage L of the second driving voltage VGL. Thus, the second node SR_QB has the low voltage L.

The fourth transistor M4 is turned on based on the low voltage L of the second node SR_QB. The fifth transistor M5 is turned off based on the high voltage H of the first clock signal CLK1.

The eighth transistor M8 is turned off based on the high voltage H of the second dimming clock signal D_CLK2. The fourth node Q has the low voltage L applied during a pervious period by the first capacitor C1.

The seventh transistor M7 is turned on, based on the low voltage L of the fourth node Q, to provide the third node QB with the high voltage H of the first driving voltage VGH. Thus, the third node QB had the high voltage H.

The sixth transistor M6 is turned off based on the high voltage H of the third node QB.

The ninth transistor M9 is turned off based on the high voltage H of the third node QB.

The tenth transistor M10 is turned on, based on the low voltage L of the fourth node Q, to provide the first capacitor C1 with the high voltage H of the first dimming clock signal D_CLK1.

The eleventh transistor T11 is turned off based on the high voltage H of the third node QB. The twelfth transistor T12 is turned on based on the low voltage L of the fourth node Q.

The twelfth transistor M12 of a PMOS transistor is not completely turned on when a gate voltage that is the low voltage L of the fourth node Q is not a sufficient low voltage such as the boosting voltage VL. Thus, an output voltage of the twelfth transistor M12 has a middle voltage MV greater than the low voltage L by a threshold voltage of the twelfth transistor M12. Thus, the output terminal OT outputs the middle voltage MV, which is the output voltage of the twelfth transistor M12.

Therefore, the output terminal OT outputs the middle voltage MV of the first emission control signal EM1.

During a fourteenth period t14, the start control signal FLM has the low voltage L, the first clock signal CLK1 has the low voltage L, the second clock signal CLK2 has the high voltage H, the first dimming clock signal D_CLK1 has the low voltage L, and the second dimming clock signal D_CLK2 has the high voltage H.

The first and third transistors M1 and M3 are turned off based on the high voltage H of the second clock signal CLK2. The first node SR_Q has the low voltage L applied during a pervious period by the fourth capacitor C4.

The second transistor M2 is turned on based on the low voltage L of the first node SR_Q. The third transistor M3 is turned off based on the high voltage H of the second clock signal CLK. The second transistor M2 provides the second node SR_QB with the high voltage H of the second clock signal CLK2. Thus, the second node SR_QB has the high voltage H.

The fourth transistor M4 is turned off based on the high voltage H of the second node SR_QB. The fifth transistor M5 is turned on based on the low voltage L of the first clock signal CLK1.

The eighth transistor M8 is turned off based on the high voltage H of the second dimming clock signal D_CLK2. The fourth node Q has the low voltage L applied during a pervious period by the first capacitor C1.

The seventh transistor M7 is turned on based on the low voltage L of the fourth node Q. The seventh transistor M7 provides the third node QB with the high voltage H of the first driving voltage VGH. Thus, the third node QB has the high voltage H.

The sixth transistor M6 is turned off based on the high voltage H of the third node QB.

The ninth transistor M9 is turned off based on the high voltage H of the third node QB.

The tenth transistor M10 is turned on, based on the low voltage L of the fourth node Q, to provide the first capacitor C1 with the low voltage L of the first dimming clock signal D_CLK1.

The fourth node Q is coupled with the first capacitor C1. Thus, the voltage of the second node SR_QB is dropped to a boosting voltage VL lower than the low voltage L according to bootstrapping by voltage regulation of the first dimming clock signal D_CLK1 applied to the first capacitor C1. The fourth node Q has boosting voltage VL.

The eleventh transistor T11 is turned off based on the high voltage H of the third node QB. The twelfth transistor T12 is turned on based on the boosting voltage VL of the fourth node Q.

The twelfth transistor T12 provides the output terminal OT with the low voltage L of the second driving voltage VGL. Thus, the output terminal OT outputs the low voltage L of the first emission control signal EM1.

The methods, processes, and/or operations described herein may be performed by code or instructions to be executed by a computer, processor, controller, or other signal processing device. The computer, processor, controller, or other signal processing device may be those described herein or one in addition to the elements described herein. Because the algorithms that form the basis of the methods (or operations of the computer, processor, controller, or other signal processing device) are described in detail, the code or instructions for implementing the operations of the method embodiments may transform the computer, processor, controller, or other signal processing device into a special-purpose processor for performing the methods herein.

The controllers, generators, drivers, and other processing features of the embodiments disclosed herein may be implemented in logic which, for example, may include hardware, software, or both. When implemented at least partially in hardware, the controllers, generators, drivers, and other processing features may be, for example, any one of a variety of integrated circuits including but not limited to an application-specific integrated circuit, a field-programmable gate array, a combination of logic gates, a system-on-chip, a microprocessor, or another type of processing or control circuit.

When implemented in at least partially in software, the controllers, generators, drivers, and other processing features may include, for example, a memory or other storage device for storing code or instructions to be executed, for example, by a computer, processor, microprocessor, controller, or other signal processing device. The computer, processor, microprocessor, controller, or other signal processing device may be those described herein or one in addition to the elements described herein. Because the algorithms that form the basis of the methods (or operations of the computer, processor, microprocessor, controller, or other signal processing device) are described in detail, the code or instructions for implementing the operations of the method embodiments may transform the computer, processor, controller, or other signal processing device into a special-purpose processor for performing the methods described herein.

In accordance with one or more of the aforementioned embodiments, the falling period of the emission control signal may be controlled by a plurality of dimming clock signals, which are delayed relative to one another. Thus, the pulse width of the emission control signal may be adjusted corresponding to the delay difference between the dimming clock signals, to thereby adjust the luminance level of the display panel.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise indicated. Accordingly, it will be understood by those of skill in the art that various changes in form and details may be made without departing from the spirit and scope of the present invention as set forth in the following claims.

What is claimed is:

1. An emission driver, comprising:
a plurality of circuit stages to output a plurality of emission control signals, each of the circuit stages including:
a first signal generator to generate a first node signal of a first node and a second node signal of a second node based on a carry signal and a second clock signal;
a second signal generator to generate a third node signal of a third node based on a first clock signal and the first and second node signals, the first clock signal delayed from the second clock signal and having a phase same as the second clock signal;
a pull-up circuit to pull up an emission control signal to a first driving voltage based on the third node signal;
a pull-up controller to control the third node signal based on a fourth node signal of a fourth node;
a pull-down circuit to pull down the emission control signal to a second driving voltage lower than the first driving voltage based on the fourth node signal; and
a first pull-down controller to control the fourth node signal based on a first dimming clock signal and a second dimming clock signal delayed from the first dimming clock signal, wherein the first and second dimming clock signals have a phase different from the first and second clock signals.

2. The emission driver as claimed in claim 1, wherein each of the circuit stages further includes a second pull-down controller to control the fourth node signal based on the third node signal.

3. The emission driver as claimed in claim 1, wherein the first and second dimming clock signals have a repetitive period corresponding to two horizontal periods and a pulse width greater than the first and second clock signals.

4. The emission driver as claimed in claim 1, wherein the first pull-down controller includes:
a first transistor including a control electrode to receive the second dimming clock signal, an input electrode to receive a carry signal, and an output electrode connected to the fourth node;
a first capacitor including a first electrode connected to the fourth node;
a second transistor including a control electrode connected to the third node, an input electrode to receive the first driving voltage, and an output electrode connected to a second electrode of the first capacitor; and
a third transistor including a control electrode connected to the fourth node, an input electrode to receive the first dimming clock signal, and an output electrode connected to the second electrode of the first capacitor.

5. The emission driver as claimed in claim 4, wherein the first pull-down controller includes a second capacitor including a first electrode to receive the first driving voltage and a second electrode connected to the second electrode of the first capacitor.

6. The emission driver as claimed in claim 1, wherein the first signal generator includes:
a first transistor including a control electrode to receive the second clock signal, an input electrode to receive the carry signal, and an output electrode connected to the first node;
a second transistor including a control electrode connected to the first node, an input electrode to receive the second clock signal, and an output electrode connected to the second node;
a third transistor including a control electrode to receive the second clock signal, an input electrode to receive the second driving voltage, and an output electrode connected to the second node; and
a first capacitor including a first electrode connected to the first node and a second electrode receiving the first driving voltage.

7. The emission driver as claimed in claim 6, wherein the second signal generator includes:
a second capacitor;
a fourth transistor including a control electrode connected to the second node, an input electrode to receive the first clock signal, and an output electrode connected to the first electrode of the second capacitor; and
a fifth transistor including a control electrode to receive the first clock signal, an input electrode connected to the second electrode of the second capacitor, and an output electrode connected to the third node.

8. The emission driver as claimed in claim 1, wherein the pull-down circuit includes:
a transistor including a control electrode connected to the fourth node, an input electrode to receive the second driving voltage, and an output electrode connected to an output terminal to output the emission control signal.

9. The emission driver as claimed in claim 1, wherein the pull-up circuit includes:
a transistor including a control electrode connected to the third node, an input electrode to receive the first driving voltage, and an output electrode connected to an output terminal to output the emission control signal; and
a capacitor including a first electrode to receive the first driving voltage and a second electrode connected to the third node.

10. The emission driver as claimed in claim 1, wherein the pull-up circuit includes a transistor including a control electrode connected to the fourth node, an input electrode to receive the first driving voltage, and an output electrode connected to the third node.

11. The emission driver as claimed in claim 1, wherein a width of the emission control signal is adjusted corresponding to a delay difference between the first and second dimming clock signals.

12. The emission driver as claimed in claim 1, wherein the emission control signal has a high voltage level, a middle voltage level, and a low voltage level, and has the middle voltage level for a delay difference between the first and second dimming clock signals.

13. A display apparatus, comprising:
a display panel including a pixel which includes an organic light emitting diode and an emission control transistor to drive the organic light emitting diode;
a timing controller to generate a first clock signal, a second clock signal delayed from the first clock signal, a first dimming clock signal, and a second dimming clock signal delayed from the first dimming clock signal;
an emission driver to output an emission control signal to the emission control transistor, control a rising period of the emission control signal based on the first and second clock signals, and control a falling period of the emission control signal based on the first and second dimming clock signals, wherein the emission driver includes a plurality of circuit stages and where each of the circuit stages includes:
a first signal generator to generate a first node signal of a first node and a second node signal of a second node based on a carry signal and a second clock signal;
a second signal generator to generate a third node signal of a third node based on the first clock signal and the first and second node signals, the first clock signal delayed from the second clock signal and having a phase same as the second clock signal;
a pull-up circuit to pull up an emission control signal to a first driving voltage based on the third node signal;
a pull-up controller to control the third node signal of the third node based on a fourth node signal of a fourth node;
a pull-down circuit to pull down the emission control signal to a second driving voltage lower than the first driving voltage based on the fourth node signal; and
a first pull-down controller to control the fourth node signal based on the first dimming clock signal and a second dimming clock signal delayed from the first dimming clock signal, the first and second dimming clock signals having a phase different from the first and the second clock signals.

14. The display apparatus as claimed in claim 13, wherein each of the circuit stages further includes a second pull-down controller to control the fourth node signal based on the third node signal.

15. The display apparatus as claimed in claim 13, wherein the first and second dimming clock signals have a repetitive period corresponding to two horizontal periods and a pulse width greater than the first and second clock signals.

16. The display apparatus as claimed in claim 13, wherein the first pull-down controller includes:
- a first transistor including a control electrode to receive the second dimming clock signal, an input electrode receiving the Carry signal, and an output electrode connected to the fourth node;
- a first capacitor including a first electrode connected to the fourth node;
- a second transistor including a control electrode connected to the third node, an input electrode to receive the first driving voltage, and an output electrode connected to a second electrode of the first capacitor; and
- a third transistor circuit including a control electrode connected to the fourth node, an input electrode to receive the first dimming clock signal, and an output electrode connected to the second electrode of the first capacitor.

17. The display apparatus as claimed in claim 16, wherein the first pull-down controller includes a second capacitor including a first electrode receiving the first driving voltage and a second electrode connected to the second electrode of the first capacitor.

18. The display apparatus as claimed in claim 13, wherein the first signal generator includes:
- a first transistor including a control electrode to receive the second clock signal, an input electrode to receive the carry signal, and an output electrode connected to the first node;
- a second transistor including a control electrode connected to the first node, an input electrode to receive the second clock signal, and an output electrode connected to the second node;
- a third transistor including a control electrode to receive the second clock signal, an input electrode to receive the second driving voltage, and an output electrode connected to the second node; and
- a first capacitor including a first electrode connected to the first node and a second electrode to receive the first driving voltage.

19. The display apparatus as claimed in claim 18, wherein the second signal generator includes:
- a second capacitor;
- a fourth transistor including a control electrode connected to the second node, an input electrode to receive the first clock signal, and an output electrode connected to the first electrode of the second capacitor; and
- a fifth transistor including a control electrode to receive the first clock signal, an input electrode connected to the second electrode of the second capacitor, and an output electrode connected to the third node.

20. The display apparatus as claimed in claim 13, wherein the pull-down circuit including a transistor including a control electrode connected to the fourth node, an input electrode to receive the second driving voltage, and an output electrode connected to an output terminal outputting the emission control signal.

21. The display apparatus as claimed in claim 13, wherein the pull-up circuit includes:
- a transistor including a control electrode connected to the third node, an input electrode to receive the first driving voltage, and an output electrode connected to an output terminal outputting the emission control signal; and
- a capacitor including a first electrode to receive the first driving voltage and a second electrode connected to the third node.

22. The display apparatus as claimed in claim 13, wherein the pull-up controller includes:
- a transistor including a control electrode connected to the fourth node, an input electrode to receive the first driving voltage, and an output electrode connected to the third node.

* * * * *